(12) United States Patent
Fukata et al.

(10) Patent No.: US 6,518,081 B2
(45) Date of Patent: Feb. 11, 2003

(54) METHOD OF MAKING TFT-BASED PIXEL STRUCTURE

(75) Inventors: Tamaki Fukata, Tokyo (JP); Nobuaki Honbo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/033,415

(22) Filed: Dec. 28, 2001

(65) Prior Publication Data

US 2002/0089617 A1 Jul. 11, 2002

Related U.S. Application Data

(62) Division of application No. 09/538,904, filed on Mar. 20, 2000.

(30) Foreign Application Priority Data

Apr. 16, 1999 (JP) ............................................ 11-109979

(51) Int. Cl.[7] ............................................... H01L 21/00
(52) U.S. Cl. .............................. 438/34; 349/44; 438/30
(58) Field of Search ...................... 117/43, 47; 257/57, 257/59, 72, 347; 349/38, 42–44, 46, 92, 93, 95, 110, 111, 113, 143; 438/30, 34, 35, 40

(56) References Cited

U.S. PATENT DOCUMENTS

| | | | | |
|---|---|---|---|---|
| 5,377,031 A | * | 12/1994 | Vu et al. | 349/45 |
| 5,783,338 A | * | 7/1998 | Cho | 430/7 |
| 6,091,466 A | * | 7/2000 | Kim et al. | 349/43 |
| 6,268,895 B1 | * | 7/2001 | Shimada et al. | 349/110 |
| 6,330,044 B1 | * | 12/2001 | Murade | 349/44 |

FOREIGN PATENT DOCUMENTS

| | | | | |
|---|---|---|---|---|
| JP | 01-124824 | 5/1989 | | G02F/1/133 |
| JP | 04-133033 | 5/1992 | | G02F/1/136 |

* cited by examiner

*Primary Examiner*—Michael Sherry
*Assistant Examiner*—Asok Kumar Sarkar
(74) *Attorney, Agent, or Firm*—Hayes Soloway PC

(57) ABSTRACT

A reflected light from the edge of a back shield film 3 and an incident light from the edge of a black matrix are blocked by forming a dummy contact hole 7 not reaching the back shield film 3 at least in the interlayer film 4 on the back shield film near the lateral face of the thin film transistor along the longitudinal direction of the channel within the region delimited by the back shield film 3 and the black matrix 12, and forming a film made of at least an interconnection material on the side wall of the dummy contact hole.

6 Claims, 14 Drawing Sheets

METHOD OF MAKING TFT-BASED PIXEL STRUCTURE

CROSS-REFERENCE TO RELATED APPLICATIONS

This application is a divisional of application Ser. No. 09/538,904, filed Mar. 20, 2000.

BACKGROUND OF THE INVENTION

1. Field of the Invention

This invention relates to a pixel structure comprising thin film transistors (TFT) such as a liquid-crystal projector. In particular, it relates to improvement in light shielding in an active matrix type of liquid-crystal display for a light valve where liquid crystal is switched by a TFT. This invention also relates to a method for manufacturing the pixel structure.

2. Description of the Prior Art

A variety of displays using a liquid-crystal panel has been recently developed as a wall-hung or projection-type TV or a display for an OA device. Among liquid-crystal panels, an active matrix type of liquid-crystal display where a thin film transistor as an active element is incorporated in a liquid-crystal display is promising in providing a high-quality display for an OA device or a display for a high definition because increase in the number of scanning lines does not adversely affect contrast or a response speed. It may allow large display to be easily achieved in a projection-type of liquid-crystal display such as liquid-crystal projection.

In a common active matrix type of liquid-crystal display for a light valve used for liquid-crystal projection, an intense light is radiated to a small device for switching liquid crystal by a TFT to turn ON/OFF per a pixel; a transmitted light is controlled, depending on image data; and the transmitted light is extendedly projected on a screen via an optical system such as a lens. When an active layer in the TFT is made of polysilicon (p-Si), a leak current during OFF may be generated in a channel of the TFT by photoexcitation not only due to an incident light but also due to a reflected light from an optical system such as a lens.

In such a conventional active matrix type of liquid-crystal display for a light valve, gate lines 8 and data lines 10 are arranged in a matrix form, i.e., they are orthogonal to each other. A transparent electrode such as ITO 18 is formed in a region delimited by the gate and the data lines while a TFT is formed in a crossing of a gate line 8 with a data line 10 as illustrated in FIG. 11. FIG. 12 is an enlarged view of the area encircled in FIG. 11, showing a TFT-forming area. In the data line 10, there is formed a data-line/TFT contact 16 for supplying a signal to a source electrode 13. A drain electrode 14 is connected to ITO 18 as a pixel electrode via an ITO/TFT contact 17. An LDD region 15 is formed between the channel (the area covered by the gate line.) of the TFT and a source-drain region. FIG. 13 shows cross sections (a) and (b) taken on lines F–F' and G–G' of FIG. 12, respectively. In the figure, a film for blocking a light from a rear face (referred to as a "back shield film") 3 via a base insulating film 2 and a black matrix 12 above the TFT are formed on a transparent insulating substrate such as a glass substrate 1. Thus, when a light enters through a liquid-crystal layer from the side of an opposed substrate to the TFT, the black matrix 12 blocks the incident light (IL) while the back shield film 3 blocks a reflected light (RL) from an optical system.

The black matrix 12 may be formed on the same substrate as the TFT via an interlayer film as illustrated in FIG. 13 or on the opposed substrate to the TFT via the liquid-crystal layer. When the black matrix 12 is formed on the opposed substrate to the TFT, it must be larger than the back shield film 3 in the light of misalignment by about 10 μm as a precision in superposing the two substrates. As a result, an opening ratio cannot be increased.

To date, the black matrix is, therefore, always formed on the same substrate as the TFT. In such a structure, a large margin as described above is not necessary because a higher alignment precision can be achieved employing a semiconductor device manufacturing method. However, since positional relationship between two shield films and the TFT is not taken into consideration, a light due to irregular reflection within a panel is not been sufficiently blocked. In particular, in the gate-line forming region as shown in FIG. 13(b), there are formed the back shield film 3 and also the black matrix 12, which are adequate to block a light. On the other hand, in a region around the pixel electrode as shown in FIG. 13(a), the back shield film 3 and the black matrix 12 are limited in their widths for improving a pixel opening ratio. An incident light from the edge of the black matrix 12 is, therefore, reflected on the surface of the back shield film 3 in the region around the pixel electrode in the polysilicon channel between the source and the drain electrodes 13, 14 and the LDD region 15, and a reflected light from the edge of the back shield film 3 enters into the LDD region 15. These reflected lights might cause current leak. Of course, the incident and the reflected lights contain not only directional components parallel to the gate line as described above, but also various directional components, among of which may enter the channel region under the gate line.

Of course, although the widths of the back shield film and the black matrix can be increased to prevent the incidence or reflected light from entering the channel, it leads to reduction in a pixel-opening ratio.

SUMMARY OF THE INVENTION

Thus, an object of this invention is to provide a pixel structure for a light valve where a pixel opening-ratio can be as large as possible, while preventing an incident light from a substrate surface or a reflected light from an optical system from entering the channel.

This invention provides a TFT (thin film transistor) based pixel structure comprising a back shield film formed on a transparent insulating substrate; a TFT consisting of a polysilicon channel formed on the back shield film with an interlayer film formed therebetween, a gate insulating film and a gate electrode connected to a gate line; a data line for transmitting a data signal to the TFT; and a black matrix for blocking an incident light to the TFT, wherein a dummy contact hole not reaching the back shield film is formed at least in the interlayer film on the back shield film near the lateral face of the TFT along the longitudinal direction of the channel within the region delimited by the back shield film and the black matrix, and a film made of at least an interconnection material is formed on the side wall of the dummy contact hole.

In the above pixel structure, it is preferable to form the dummy contact hole before forming the gate line and to deposit a gate-line material in the dummy contact hole simultaneously with forming the gate line, or to form the dummy contact hole before forming the data line and to deposit a data-line material in the dummy contact hole simultaneously with forming the data line.

This invention also provides a TFT-based pixel structure where the back shield film is formed on the transparent insulating substrate in a matrix form and is wider than the other interconnections only in the region to which the channel and the LDD are projected.

This invention also provides a pixel structure where the TFT is formed in the crossing of the gate line with the data line, and the dummy contact hole is formed at four corners of the crossing.

This invention also provides a method for manufacturing a TFT (thin film transistor)-based pixel structure comprising forming a back shield film, the first interlayer film, a polysilicon to be a channel of the TFT, a gate insulating film, a gate line including a gate electrode, the second interlayer film, a data line, the third interlayer film and a black matrix on a transparent insulating substrate in sequence, wherein after forming the gate insulating film and before forming the gate line, a dummy contact hole not reaching the back shield film is formed in the gate insulating film and the first interlayer film on the back shield film near the lateral face of the TFT along the longitudinal direction of the channel within the region delimited by the back shield film and the black matrix, and a film made of a gate-line material is formed on the side wall of the dummy contact hole simultaneously with forming the gate line, or after forming the second interlayer film and before forming the data line, a dummy contact hole not reaching the back shield film is formed in the second interlayer film, the gate insulating film and the first interlayer film on the back shield film near the lateral face of the TFT along the longitudinal direction of the channel within the region delimited by the back shield film and the black matrix, and a film made of a data-line material is formed on the side wall of the dummy contact hole simultaneously with forming the data line.

In particular, it is preferable to form the back shield film with a conductive material, to form the contact hole for controlling a potential of the back shield film by multiple etching steps, and to form the dummy contact hole simultaneously with at least one of the contact-hole etching steps.

This invention also provides a method for manufacturing a TFT-based pixel structure comprising a back shield film where the back shield film made of a conductive material is formed in a matrix form for controlling its potential, and is wider than the other interconnections only in the region to which the channel and the LDD are projected.

According to this invention, a dummy contact hole is formed near the lateral side of the channel and a film made of an interconnection material is formed within the dummy contact hole. Thus, an incident light from the edge of the black matrix or a reflected light through the edge of the back shield film from the rear face of the substrate are blocked by the interconnection material film and therefore do not reach the channel of the TFT, resulting in prevention of leak current due to photoexcitation. Furthermore, the shield film is wider only under the channel of the TFT to effectively block a reflected light from the rear face. Consequently, required areas of the black matrix and the back shield film can be minimized to avoid reduction in an opening ratio.

In addition, forming the dummy contact hole simultaneously with forming the other contact hole can eliminate an additional step for forming a dummy contact hole, resulting in minimizing manufacturing cost increase.

DETAILED DESCRIPTION OF PREFERRED EMBODIMENTS

Figure 1:
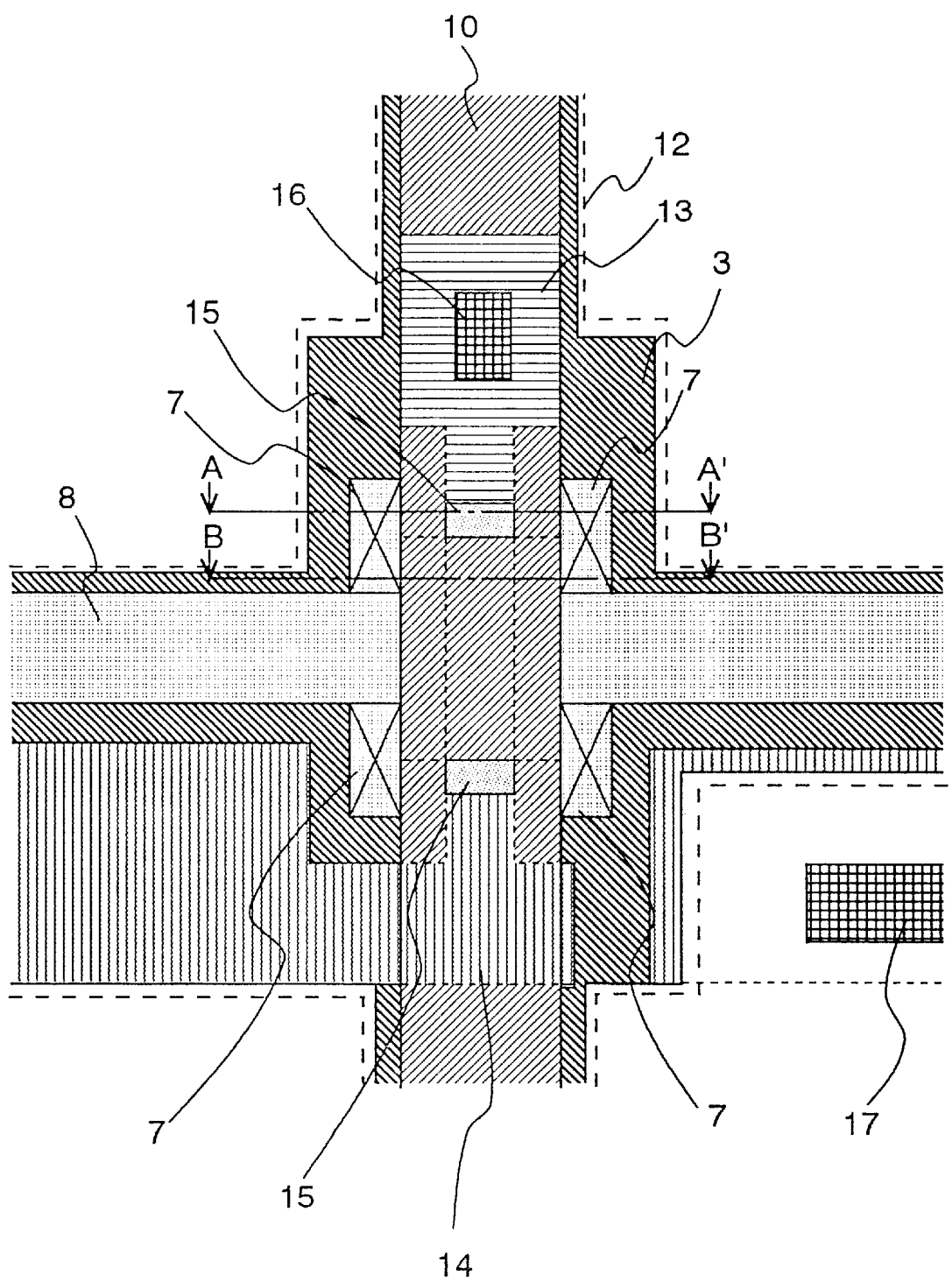
FIG. 1 is a plan view of a pixel structure according to an embodiment of this invention.
Figure 2A:
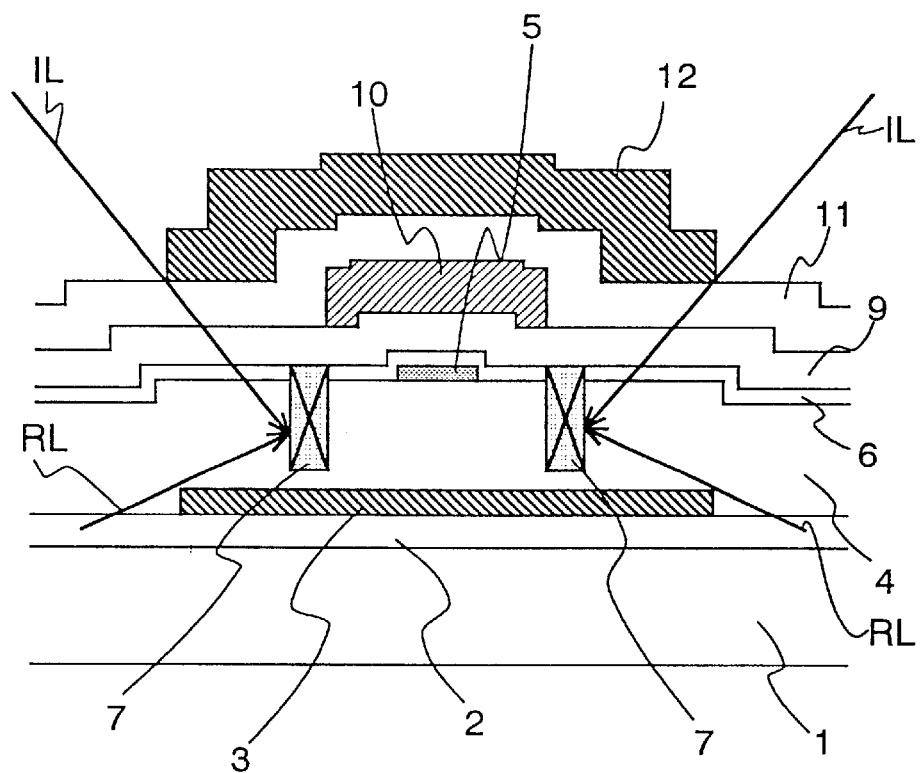
FIG. 2 shows cross sections (a) and (b) taken on lines A–A' and B–B' in the pixel structure of FIG. 1, respectively.
Figure 2B:
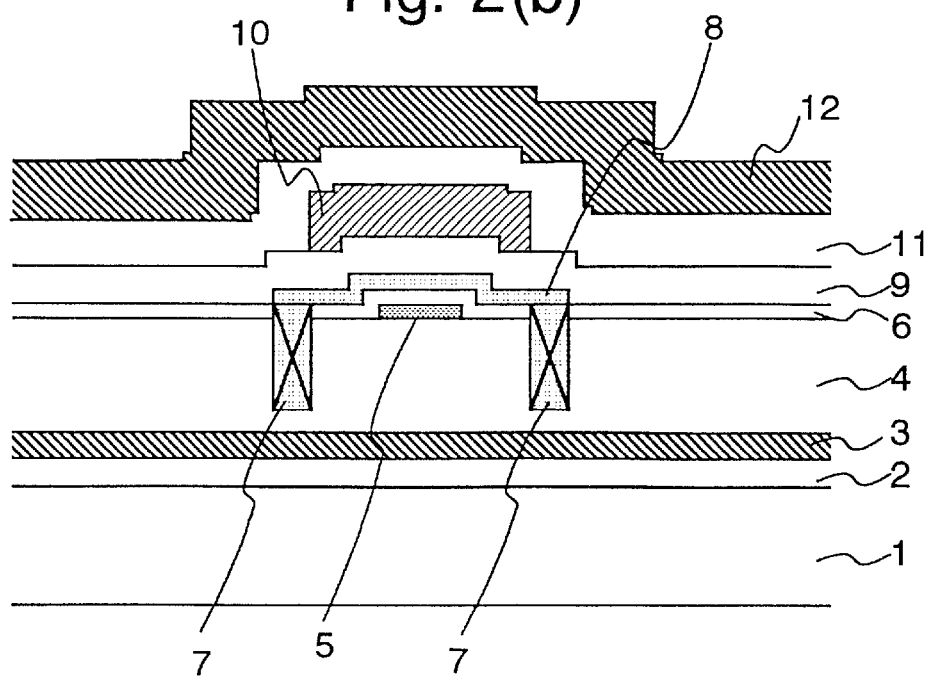

FIG. 1 is a partial plan view of the pixel structure of a light valve according to an embodiment of this invention, where a TFT is formed at the orthogonal crossing of a gate line 8 with a data line 10. In this figure, a polysilicon channel is formed under the data line 10. FIG. 2 shows cross sections (a) and (b) taken on lines A–A' and B–B' of FIG. 1, respectively. There are formed a back shield film 3 via a base insulating film 2 on a transparent insulating substrate such as a glass substrate 1 and a black matrix 12 above the TFT. The back shield film 3 is wider than the other elements only in the region under the channel and the LDD to adequately prevent a back reflected light from entering the channel made of polysilicon 5. At four corners in the crossing of the gate line 8 with the data line 10, a dummy contact hole 7 not reaching the back shield film 3 is formed in the first interlayer film 4 and the gate insulating film 6. A film made of a gate-line material is formed in the dummy contact hole 7 during forming the gate line. Thus, after patterning the gate line, the film made of the gate-line material remains at least on the side wall of the dummy contact hole 7. Consequently, as shown in FIG. 2(a), the gate-line material within the dummy contact hole 7 can block an incident light (IL) from the edge of the black matrix 12 and a reflected light (RL) from the edge of the back shield film 3 in the LDD region 15, to prevent irregular reflection to the channel made of polysilicon 5.

Figure 5:
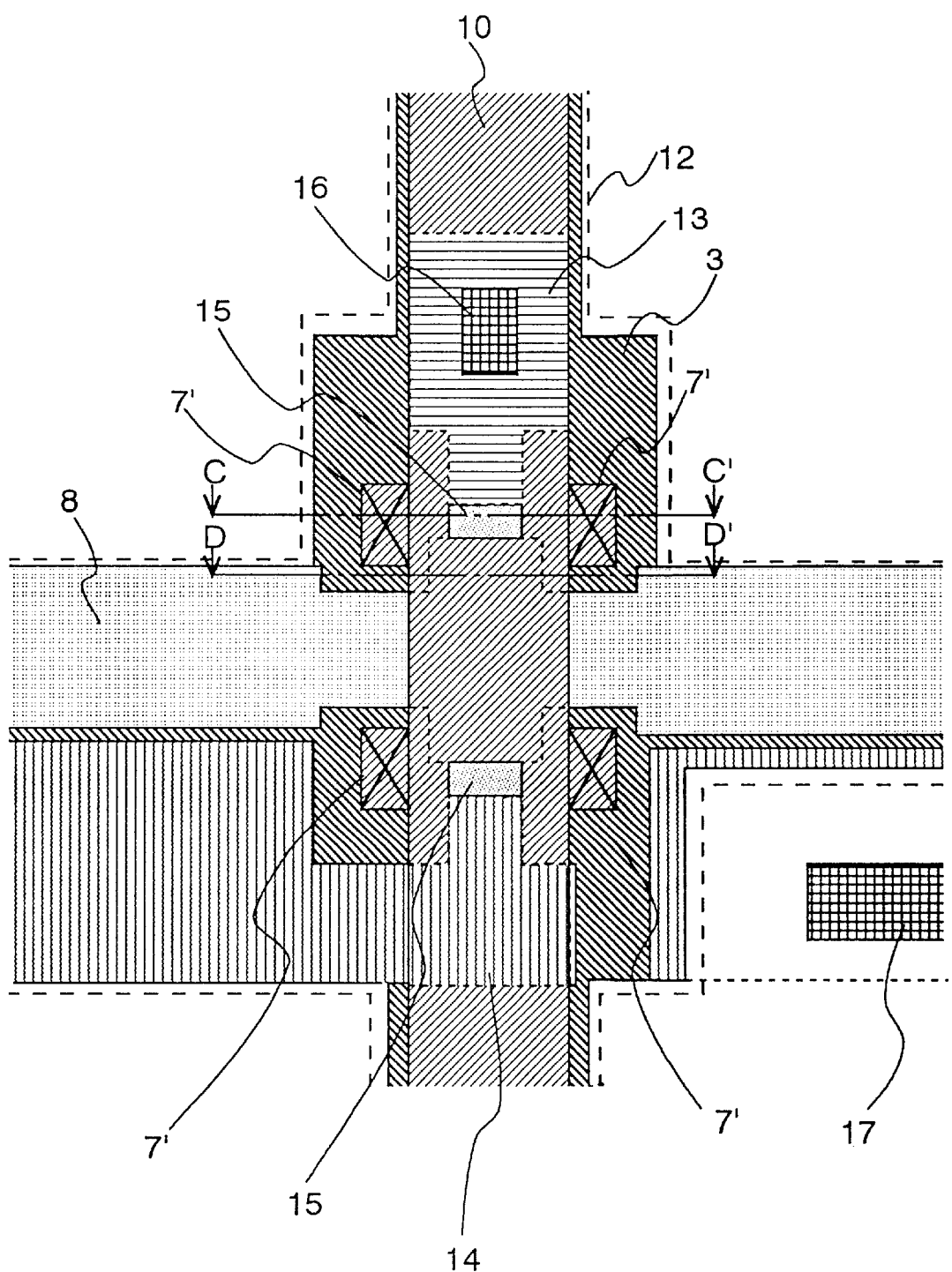
FIG. 5 is a plan view of a pixel structure according to another embodiment of this invention.
Figure 6A:
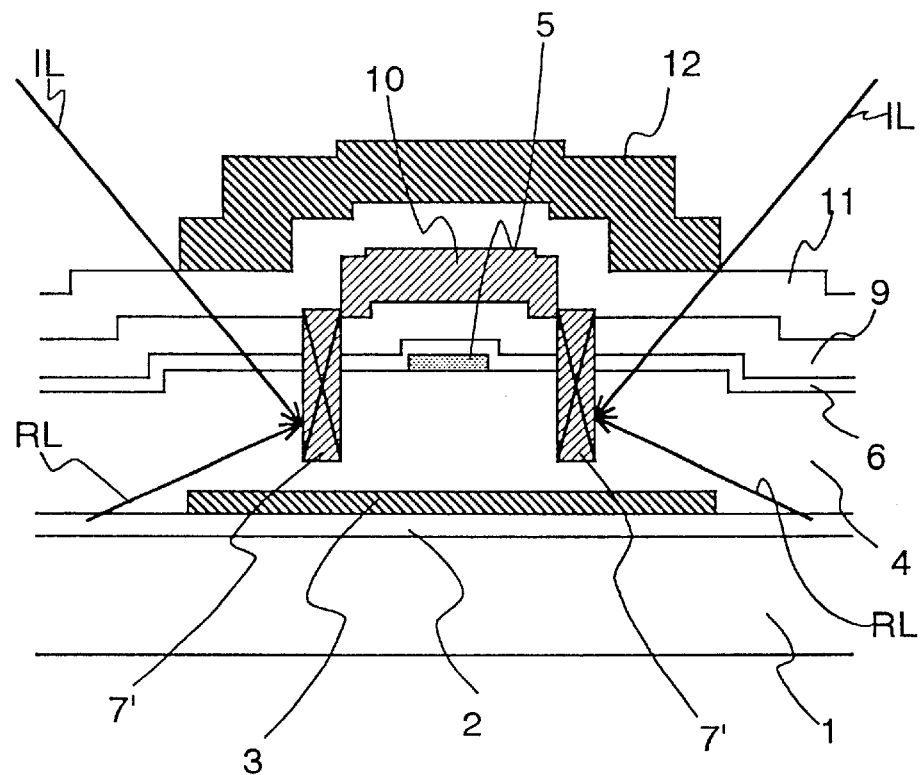
FIG. 6 shows cross sections (a) and (b) taken on lines C–C' and D–D' in the pixel structure of FIG. 5, respectively.
Figure 6B:
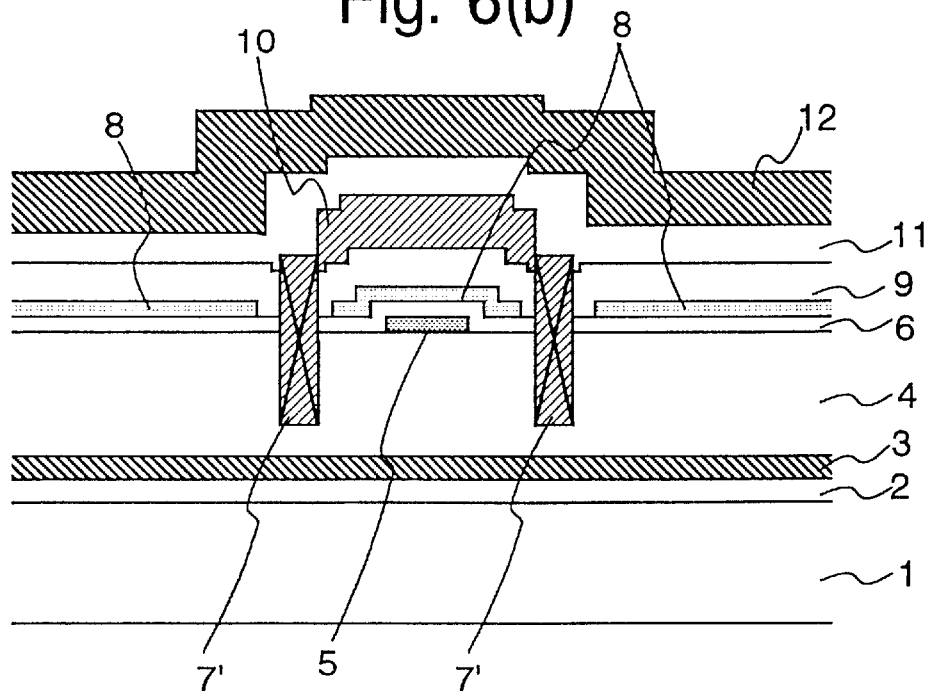
Figure 7A:
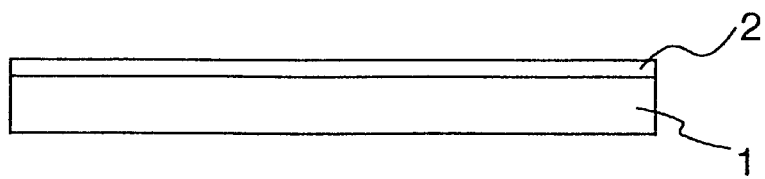
FIGS. 7(a)–(e) are cross sections illustrating the first half of steps for manufacturing the pixel structure of FIG. 5.
Figure 7B:
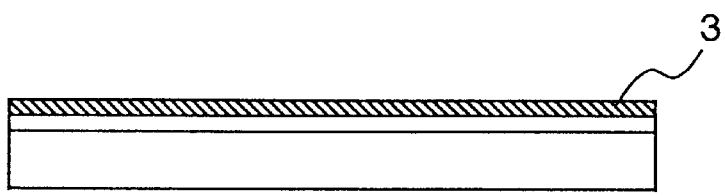
Figure 7C:
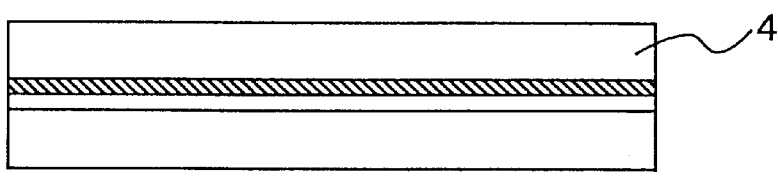
Figure 7D:
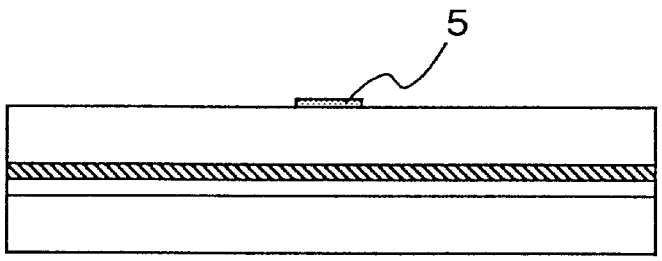
Figure 7E:
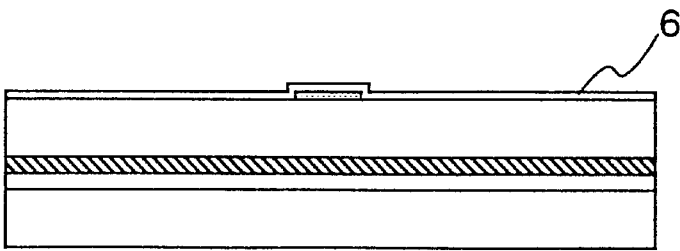

FIG. 5 illustrates another embodiment of this invention. FIG. 6 shows cross sections (a) and (b) taken on lines C–C' and D–D' of FIG. 5, respectively. This embodiment is different from that illustrated in FIGS. 1 and 2, in that a dummy contact hole 7' not reaching the back shield film 3 is formed in the second interlayer film 9, the gate insulating film 6 and the first interlayer film 4; a film made of a data-line material is formed in the dummy contact hole 7' during forming a data line; and after patterning the data line, the film made of the data-line material remains at least on the side wall of the dummy contact hole 7'. Consequently, as shown in FIG. 6(a), the data-line material within the dummy contact hole 7' can block an incident light from the edge of the black matrix 12 and a reflected light from the edge of the back shield film 3 in the LDD region 15, to prevent irregular reflection to the channel made of polysilicon 5.

Figure 14:
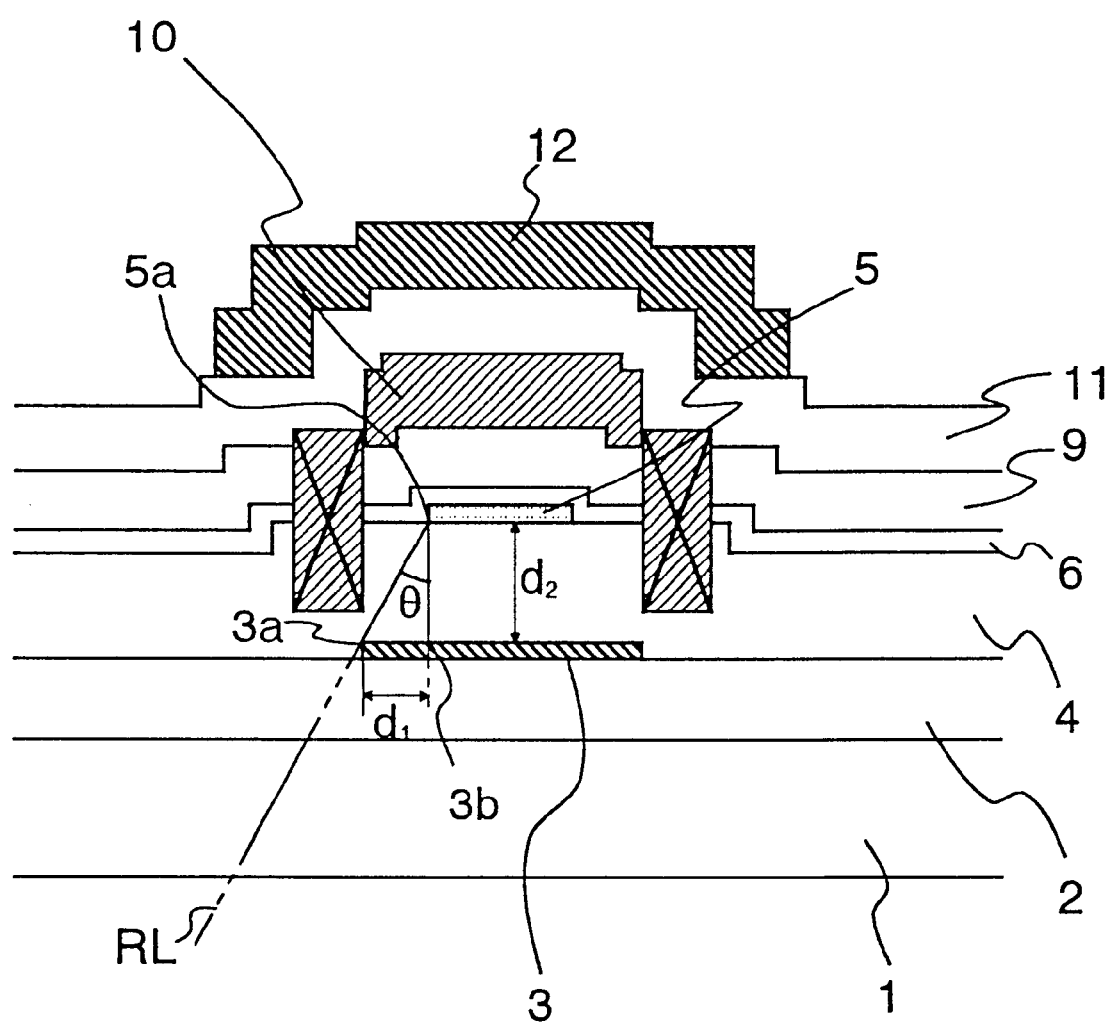
FIG. 14 shows designing for a back shield film.

The width of the back shield film is appropriately determined, taken into consideration a relationship between an opening ratio and the lower limit for avoiding a step in a data and a gate lines commonly formed above the film. However, only in the region under the channel and the LDD, is designed as exemplified in FIG. 14. In the partial cross section of the TFT along the channel width, 3a is the edge of the upper surface of the back shield film 3, 5a is the edge of the lower surface of the channel or LDD, and 3b is a crossing of the back shield film 3 with a line along the normal line of the liquid-crystal panel from 5a to the back shield film 3. An angle forming by lines 3a–5a and 5a–3b is designated as "θ". When the liquid-crystal panel is perpendicular to an outgoing light from a light source, most of the incident light pass through the liquid-crystal panel within 30° to the normal line of the panel, which has been disclosed in paragraph (0065) in JP-A 8-171101. Thus, most of the reflected light from the rear face of the substrate 1 or the optical system may be also up to 30° to the normal line of the liquid-crystal panel. To effectively block the back reflected light, the following condition must be met.

$$\theta > 30° \quad (1)$$

Therefore, there must be the following relationship between the distance of 3b–3a ($d_1$) and the thickness of the first interlayer film 4 ($d_2$).

$$d_1 > d_2 \tan 30° \quad (2)$$

This condition must be also met in the longitudinal direction of the channel. In other words, the back shield film 3 must be wider than the region to which the channel and the LDD are projected, by at least the distance $d_2$ defined by equation (2). The upper limit for $d_2$ may be appropriately determined, taking into consideration the thickness of the first interlayer film 4, the depth of the dummy contact hole 7 and the acceptable lower limit for the opening ratio.

The shape of the dummy contact hole is not limited to a rectangle as illustrated in FIG. 1 or 5, and any shape may be employed as long as it can adequately block the reflected light from the rear face. For example, the hole may have a hook shape extended along the gate line in FIG. 1. The size of the dummy contact hole is not specifically limited as long as it can provide adequately effective shield within the region delimited by the back shield film 3 and the black matrix 12. Practically, given easiness in forming a dummy contact hole, it may have the substantially same width (the longitudinal direction of the channel) as a common contact hole. Its length (the perpendicular direction to the longitudinal direction of the channel) may be varied as appropriate, depending on the distance between the channel and the dummy contact hole, as long as it can adequately prevent a light from entering the LDD region 15. The distance between the channel and the dummy contact hole is preferably larger than the thickness of the gate insulating film. In general, the contact hole may be appropriately formed in a region where it can be readily formed, depending on an interconnection pattern.

The dummy contact hole can have such a depth that it does not reach the back shield film. When it is too shallow, the dummy contact hole may not be sufficiently effective in light shielding. Thus, it must be at least reaching to about a half of the thickness of the first interlayer film although it depends on the size of the dummy contact hole and the distance between the hole and the channel.

The dummy contact hole may be formed before depositing an interconnection material in the hole. Although it may be formed by a separate forming step, it is preferably formed simultaneously with formation of the other contact hole for avoiding an additional manufacturing step in this invention. For example, when the back shield film is made of a conductive material, it is necessary to fix the potential of the back shield film to an appropriate value such as an earth potential for reducing adverse effects on the TFT. The potential is fixed commonly by forming a contact hole outside the pixel-forming region for controlling the potential. However, since the first interlayer film is relatively thick for preventing the back shield film from acting as a back gate, it is difficult to form a contact hole reaching the back shield film by a single etching step. Two or more etching steps are, therefore, required. Thus, the dummy contact hole may be formed during the first etching step, leading to avoiding increase in the number of manufacturing steps.

Figure 9:
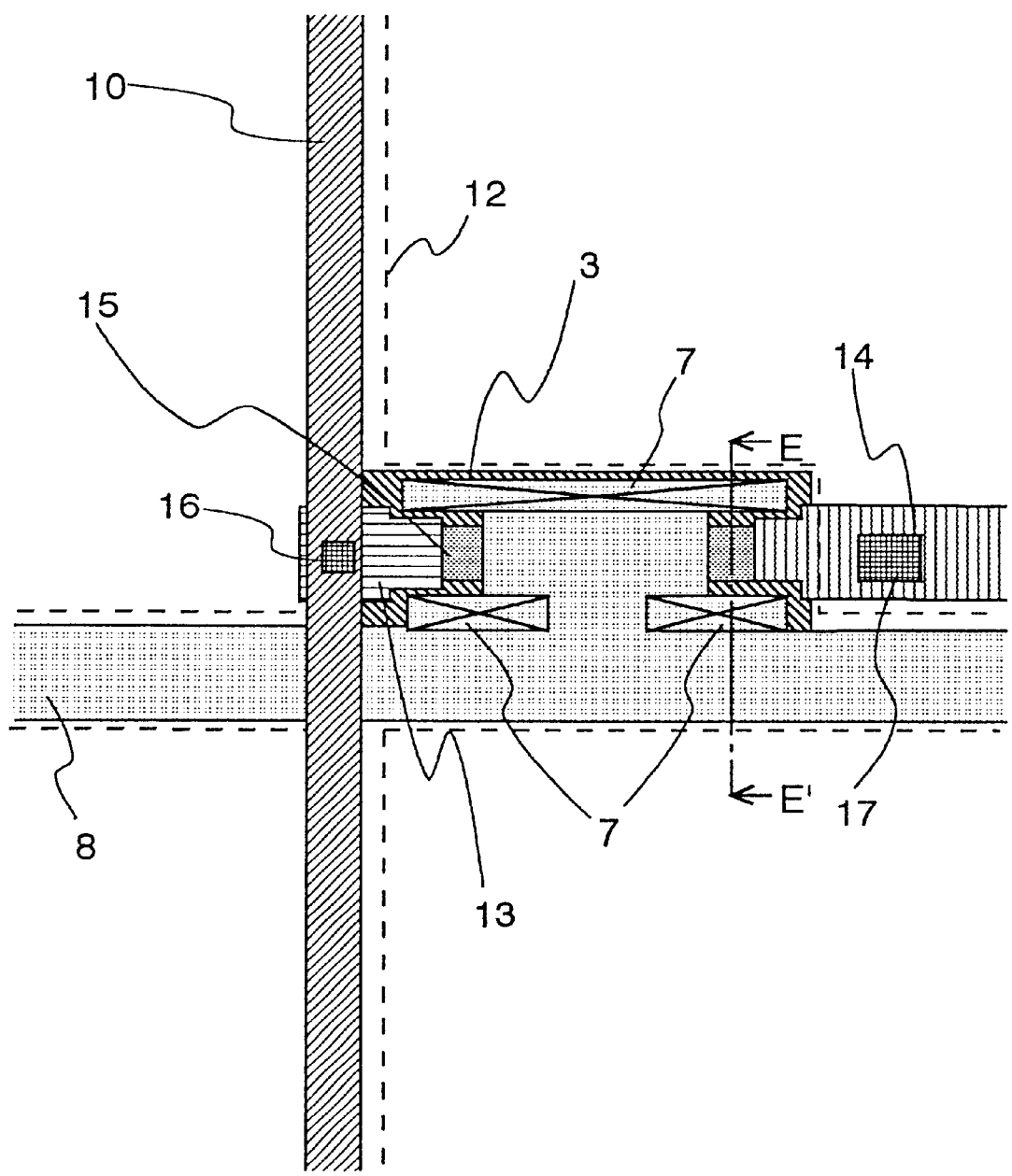
FIG. 9 is a plan view of a pixel structure according to another embodiment of this invention.
Figure 10A:
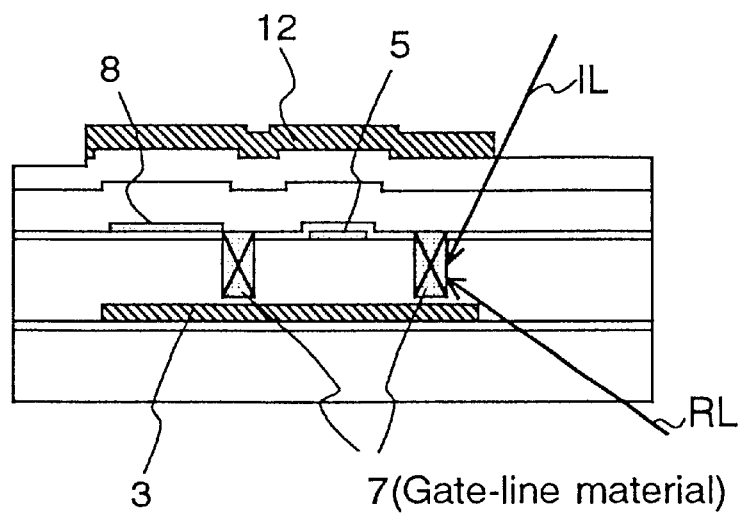
FIGS. 10(a)–(c) are cross sections taken on line E–E' of FIG. 9, where the dummy contact hole has different forms.
Figure 10B:
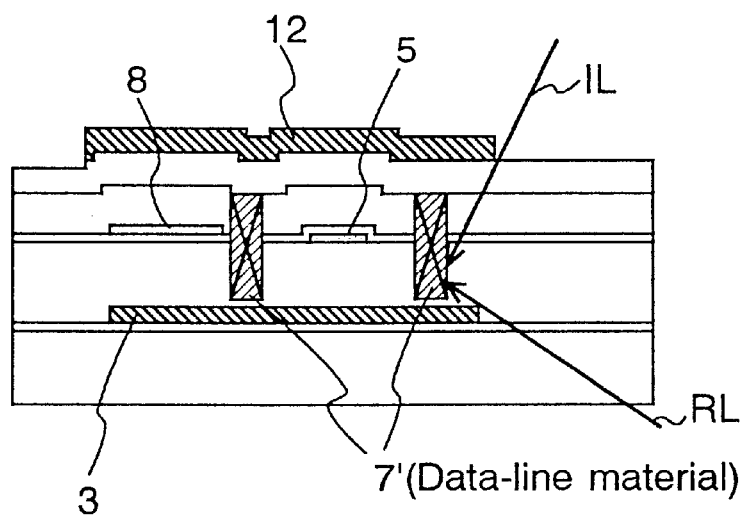
Figure 10C:
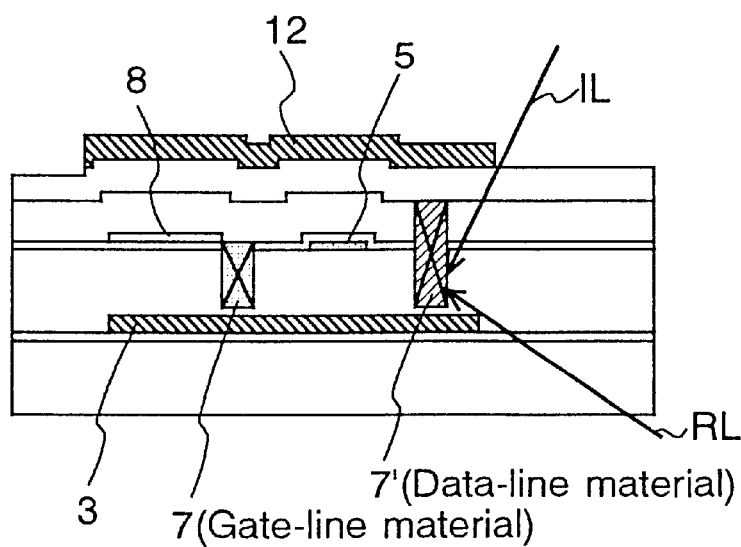
Figure 11:
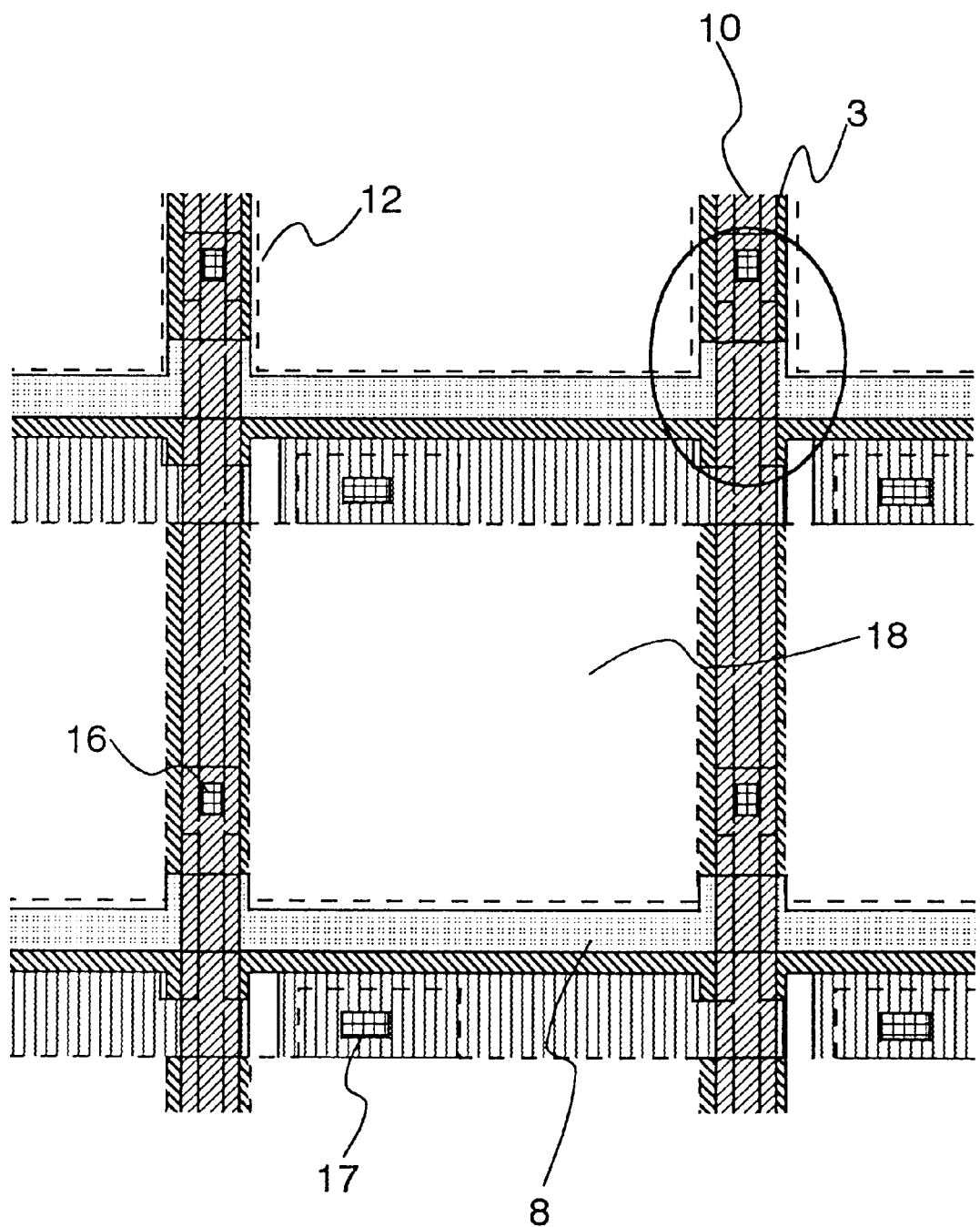
FIG. 11 is a plan view illustrating a pixel structure according to the prior art.
Figure 12:
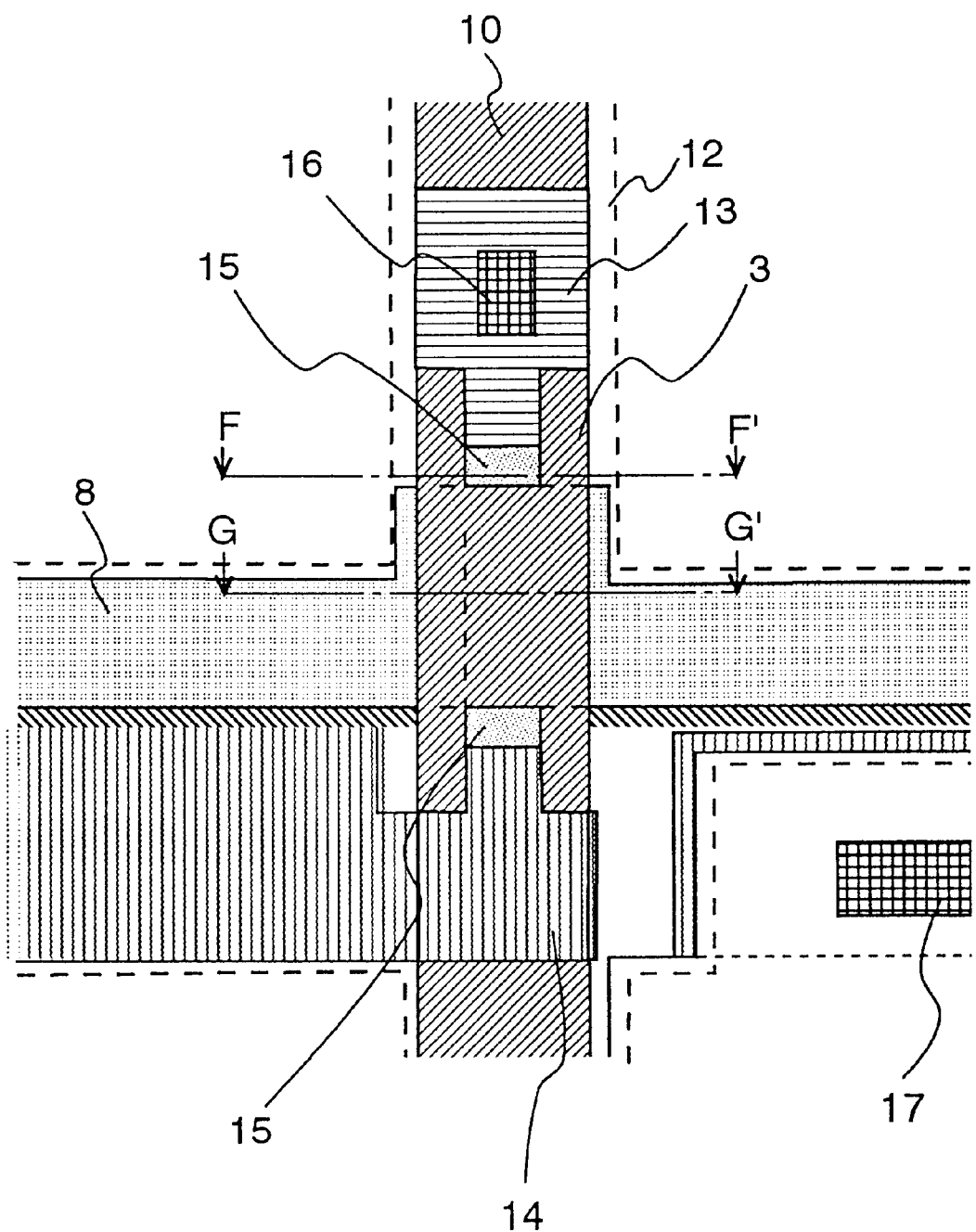
FIG. 12 is a partially enlarged view of the pixel structure of FIG. 11.
Figure 13A:
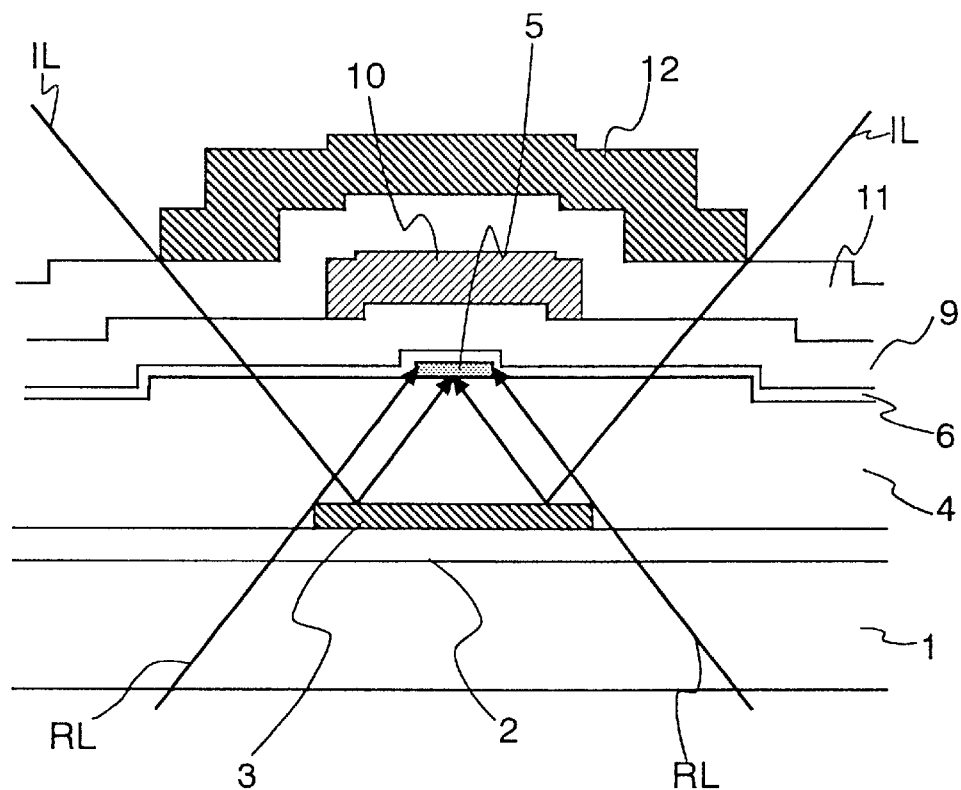
FIG. 13 shows cross sections (a) and (b) taken on lines F–F' and G–G' in the pixel structure of FIG. 12, respectively.
Figure 13B:
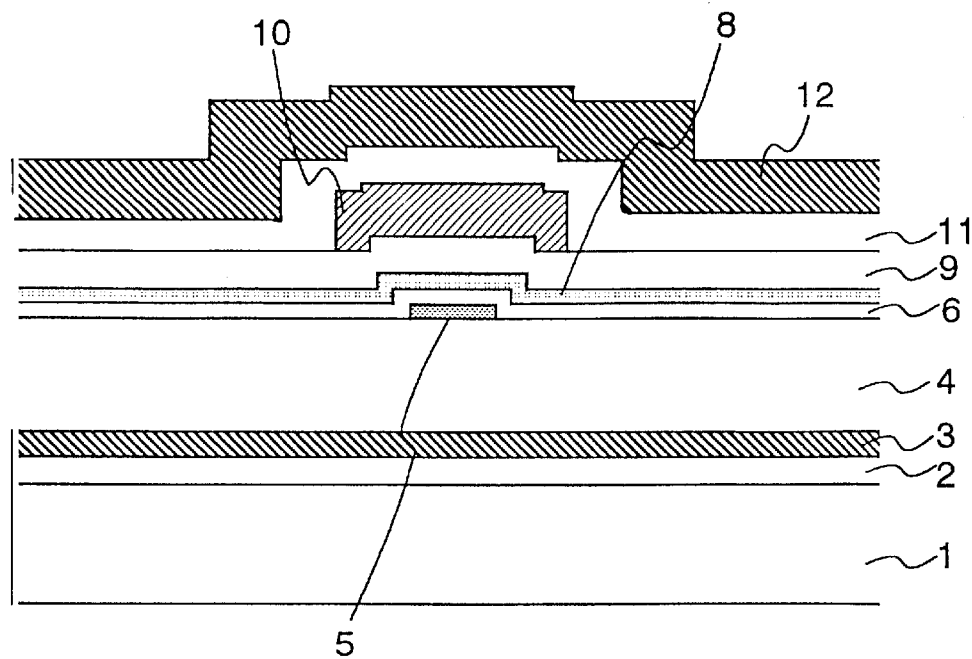

In these embodiments, there have been described the configuration where the TFT is disposed under the data line. This invention can be, however, applied to a configuration where a channel is not superposed on a data line, as illustrated in FIG. 9. Specifically, a variety of configurations may be employed as illustrated in FIG. 10 (a), (b) and (c) corresponding to cross sections taken on line E–E' of FIG. 9; configuration (a) comprising a dummy contact hole 7 in which a gate-line material is deposited, configuration (b) comprising a dummy contact hole 7' in which a gate-line material is deposited, and configuration (c) comprising dummy contact holes 7 and 7' in which a gate-line material and a data-line material are deposited, respectively. Since a dummy contact hole can be formed in an area away from a data line 10 as illustrated in FIG. 9, it is acceptable that the dummy contact hole 7' in which a data-line material is deposited is in contact with the gate line 8.

Since a source electrode 13 and a drain electrode 14 is not essential, contacts may be formed directly in the source-drain region of the TFT.

This invention will be specifically described with reference to, but not limited to, examples.

EXAMPLE 1

Figure 3A:
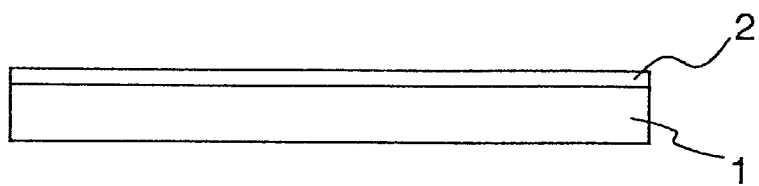
FIGS. 3(a)–(e) are cross sections illustrating the first half of steps for manufacturing the pixel structure of FIG. 1.

There will be described forming the pixel structure illustrated in FIGS. 1 and 2 where a gate-line material is deposited in a dummy contact hole. FIGS. 3 and 4 illustrate steps for manufacturing the structure of this example using cross sections taken on line B–B' of FIG. 1. First, as illustrated in FIG. 3(a), on a glass substrate 1 is formed a base insulating film 2 made of, e.g., SiN, which is a film for preventing contamination by impurities from the glass substrate and therefore may have a thickness of about 200 nm.

Figure 3B:
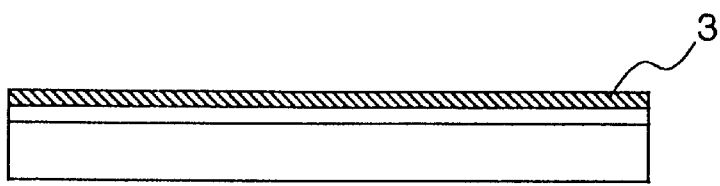

Then, as illustrated in FIG. 3(b), a back shield film 3 is deposited. Although any material may be used as long as it can block a reflected light from the substrate side, the back shield film is made of a heat resistant material such as tungsten silicide (WSi) because it will be subject to annealing during forming polysilicon in a subsequent step. When using WSi, the thickness of the back shield film 3 may be at least 100 nm, desirably at least 160 nm for effective shielding. Although there are no restrictions to the upper limit of the film thickness and it may be appropriately determined depending on a design, the thickness may be generally up to about 500 nm. It is herein about 170 nm. In patterning the back shield film, the width of the interconnection is to be, for example, 2 μm, considering the widths of the gate and the data lines. Since the first interlayer film 4 is designed to have a thickness of 1 μm as described below, the width of the back shield film under the channel and the LDD may be longer than the region to which the channel and the LDD are projected, by at least 0.6 μm in one side. For example, when the channel width, the channel length and the LDD length are 1 μm, 4 μm and 1 μm, respectively, the widths of the back shield film along the longitudinal and the cross directions of the channel are to be 7.2 μm and 2.2 μm, respectively.

Figure 3C:
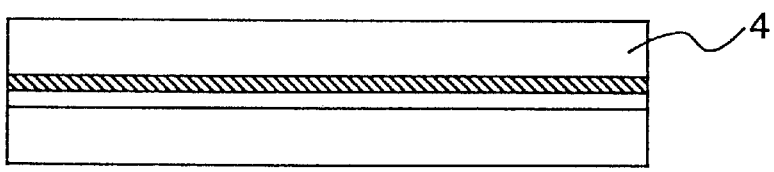

Then, as illustrated in FIG. 3(c), the first interlayer film 4 is formed, which is made of, for example, SiN. The thickness of the first interlayer film 4 is desirably at least 500 nm for preventing the back shield film 3 from acting as a back gate to the TFT. The upper limit for the film thickness may be selected as appropriate depending on a design, without any restriction. However, the thickness is desirably up to about 2 μm; herein it is about 1 μm.

Figure 3D:
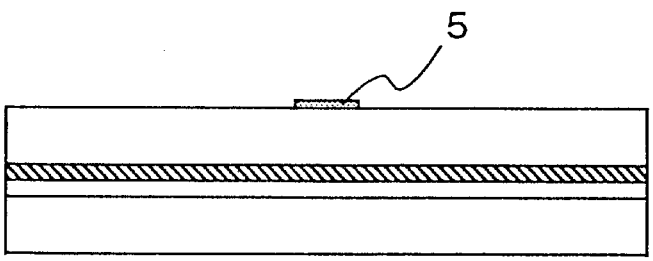
Figure 3E:
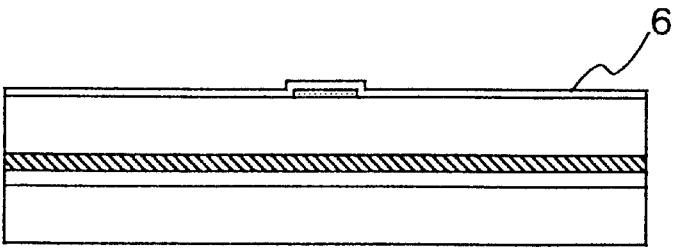

Then, as illustrated in FIG. 3(d), an insular polysilicon layer 5 is formed with a thickness of 50 nm. For example, on the first interlayer film 4 is deposited a boron-doped amorphous silicon layer by LPCVD, which is then subject to laser annealing, photolithography and etching to form the-polysilicon layer 5. A gate insulating film 6 covering the polysilicon layer 5 is deposited with a thickness of 0.1 μm by CVD (FIG. 3(e)).

Figure 4A:
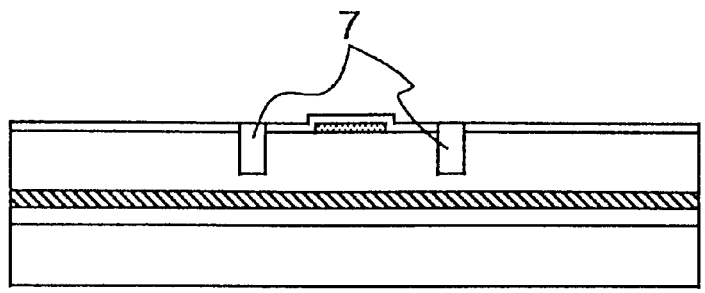
FIGS. 4(a)–(d) are cross sections illustrating the latter half of steps for manufacturing the pixel structure of FIG. 1.

Then, as illustrated in FIG. 4(a), a dummy contact holes 7 are formed in the gate insulating film 6 and the first interlayer film 4. Since the back shield film 3 has been made of WSi, a contact hole must be formed for controlling the potential of the back shield film 3. During the first etching for forming the contact hole, the dummy contact holes 7 are formed at both ends of the LDD of the pixel TFT. Herein, the dummy contact holes 7 have a width and a depth of about 500 nm and 700 nm, respectively, in this cross section.

Figure 4B:
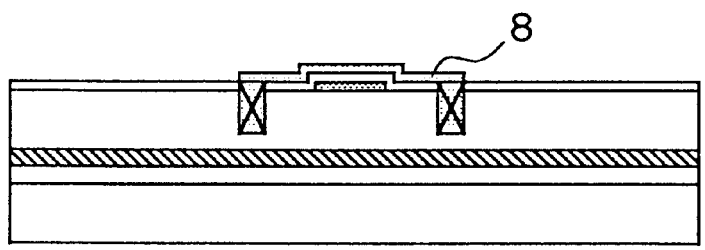

Then, as illustrated in FIG. 4(b), a layer of, for example, WSi is deposited to a thickness of about 100 nm by CVD and patterned to form a gate electrode for a gate line 8. During the process, a WSi film is also deposited in the dummy contact hole 7. Consequently, the total thickness of the WSi film on the side wall of the dummy contact hole is about 200 nm, which is adequate to effectively block a light. Then, phosphorous and boron ions are implanted into an N- and P-type MOS-TFTs, respectively, by ion implantation, to form a source and a drain regions. After the dopants are subject to activation annealing, the second etching is conducted to form the contact hole reaching the back shield film 3.

Figure 4C:
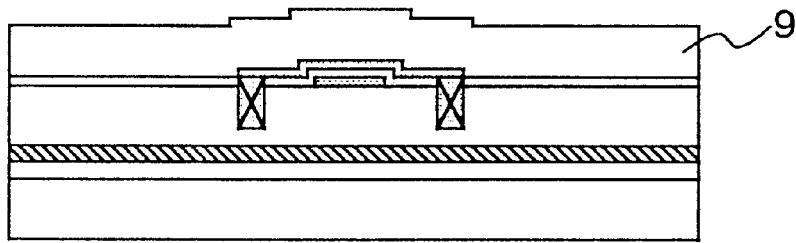
Figure 4D:
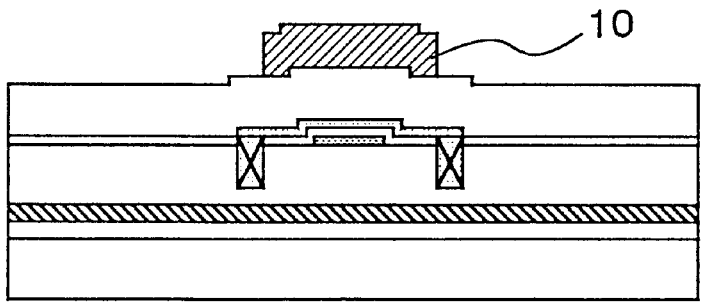

On the surface is deposited the second interlayer film 9 of, for example, SiN with a thickness of about 300 nm, by CVD (FIG. 4(c)), on which is then formed a data line 10 (400 nm thickness) of a metal material such as aluminum, as illustrated in FIG. 4(d). Then, the third interlayer film 11 and a black matrix 12 are sequentially formed. For example, the third interlayer film 11 is made of SiN with a thickness of 300 nm while the black matrix 12 is made of aluminum with a thickness of 400 nm. The second etching for forming the contact hole may be conducted simultaneously with forming the contact hole connecting the data line to the TFT.

EXAMPLE 2

There will be described forming the pixel structure illustrated in FIGS. 5 and 6 where a data-line material is deposited in a dummy contact hole. FIGS. 7 and 8 illustrate steps for manufacturing the structure of this example using cross sections taken on line D–D' of FIG. 5. FIGS. 7(a) to (e) will not be described because they are the same as FIGS. 3(a) to (e).

Figure 8A:
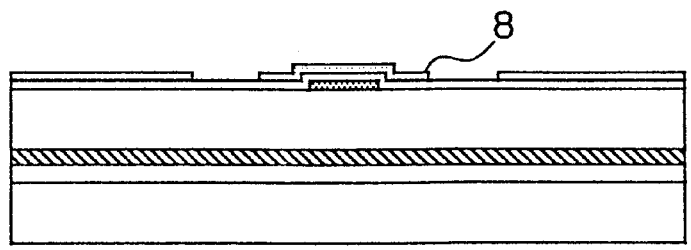
FIGS. 8(a)–(d) are cross sections illustrating the latter half of steps for manufacturing the pixel structure of FIG. 5.

Then, as illustrated in FIG. 8(a), a layer of, for example, WSi is deposited to a thickness of about 100 nm by CVD and patterned to form a gate electrode for a gate line 8. Then, phosphorous and boron ions are implanted into an N- and P-type MOS-TFTs, respectively, by ion implantation, to form a source and a drain region. The dopants are subject to activation annealing.

Figure 8B:
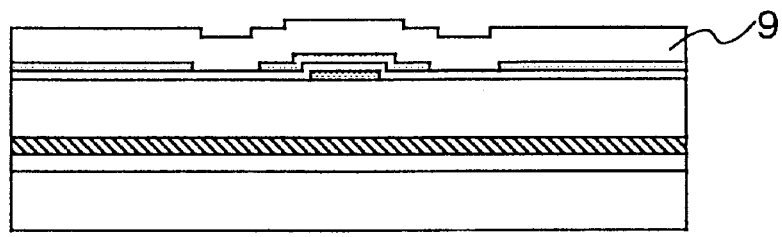

On the surface is deposited the second interlayer film 9 of, for example, SiN with a thickness of about 300 nm, by CVD (FIG. 8(b)).

Figure 8C:
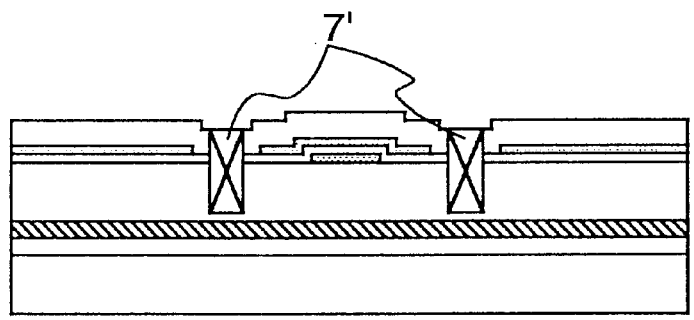

Then, as illustrated in FIG. 8(c), the second interlayer film 9, the gate insulating film 6 and the first interlayer film 4 are etched to form a dummy contact hole 7'. The first etching for forming a contact hole may be conducted to a depth of about 1 μm simultaneously with etching for forming the contact hole in the back shield film. Thus, the distance between the dummy contact hole 7' and the back shield film is about the thickness of the second interlayer film 9 (about 300 nm) while the width in the cross section is about 500 nm.

Figure 8D:
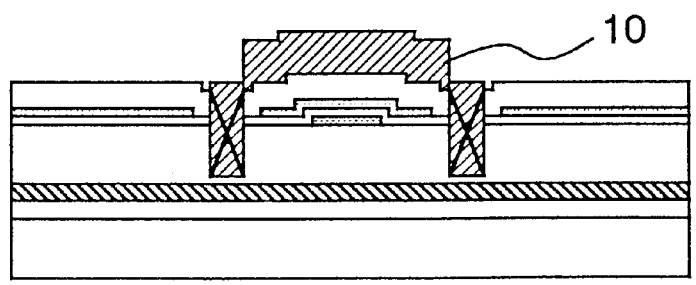

Then, as illustrated in FIG. 8(d), a data line 10 is formed with a thickness of 400 nm, during which an aluminum film is deposited in the dummy contact hole 7'. Consequently, the dummy contact hole is substantially filled with aluminum to adequately block a light. Then, the third interlayer film 11 and a black matrix 12 are sequentially formed.

What is claimed is:

1. A method for manufacturing a TFT (thin film transistor)-based pixel structure comprising forming a back shield film, the first interlayer film, a polysilicon to be a channel of the TFT, a gate insulating film, a gate line including a gate electrode, the second interlayer film, a data line, the third interlayer film and a black matrix on a transparent insulating substrate in sequence, wherein after forming the gate insulating film and before forming the gate line, a dummy contact hole not reaching the back shield film is formed in the gate insulating film and the first interlayer film on the back shield film near the lateral face of the TFT along the longitudinal direction of the channel within the region delimited by the back shield film and the black matrix, and a film made of a gate-line material is formed on the side wall of the dummy contact hole simultaneously with forming the gate line.

2. A method for manufacturing a TFT-based pixel structure as claimed in claim 1, where the back shield film is formed with a conductive material, the contact hole for controlling a potential of the back shield film is formed by multiple etching steps, and the dummy contact hole is formed simultaneously with at least one of the contact-hole etching steps.

3. A method for manufacturing a TFT-based pixel structure as claimed in claim 1, where the back shield film is formed with a conductive material in a matrix form for controlling its potential, and is wider than the other interconnections only in the region to which the channel and the LDD are projected.

4. A method for manufacturing a TFT(thin film transistor)-based pixel structure comprising forming a back shield film, the first interlayer film, a polysilicon to be a channel of the TFT, a gate insulating film, a gate line including a gate electrode, the second interlayer film, a data line, the third interlayer film and a black matrix on a transparent insulating substrate in sequence, characterized in that after forming the second interlayer film and before forming the data line, a dummy contact hole not reaching the back shield film is formed in the second interlayer film, the gate insulating film and the first interlayer film on the back shield film near the lateral face of the TFT along the longitudinal direction of the channel within the region delimited by the back shield film and the black matrix, and a film made of a data-line material is formed on the side wall of the dummy contact hole simultaneously with forming the data line.

5. A method for manufacturing a TFT-based pixel structure as claimed in claim 4, where the back shield film is formed with a conductive material, the contact hole for controlling a potential of the back shield film is formed by multiple etching steps, and the dummy contact hole is formed simultaneously with at least one of the contact-hole etching steps.

6. A method for manufacturing a TFT-based pixel structure as claimed in claim 4, where the back shield film is formed with a conductive material in a matrix form for controlling its potential, and is wider than the other interconnections only in the region to which the channel and the LDD are projected.

* * * * *

UNITED STATES PATENT AND TRADEMARK OFFICE
CERTIFICATE OF CORRECTION

PATENT NO. : 6,518,081 B2
DATED : February 11, 2003
INVENTOR(S) : Fukata et al.

It is certified that error appears in the above-identified patent and that said Letters Patent is hereby corrected as shown below:

<u>Column 8,</u>
Lines 27 and 56, insert -- film -- after "polysilicon".
Lines 37 and 67, delete "delimited by" and insert -- between --.

Signed and Sealed this

Thirteenth Day of July, 2004

JON W. DUDAS
*Acting Director of the United States Patent and Trademark Office*